United States Patent [19]

Sukigara et al.

[11] Patent Number: 4,460,673
[45] Date of Patent: Jul. 17, 1984

[54] METHOD OF PRODUCING AMORPHOUS SILICON LAYER AND ITS MANUFACTURING APPARATUS

[75] Inventors: Kunio Sukigara; Toyoki Kazama, both of Yokosuka, Japan

[73] Assignee: Fuji Electric Company, Ltd., Kawasaki, Japan

[21] Appl. No.: 382,475

[22] Filed: May 27, 1982

[30] Foreign Application Priority Data

Jun. 3, 1981 [JP] Japan ............................. 56-85505
Sep. 24, 1981 [JP] Japan ............................. 56-150949

[51] Int. Cl.³ .................. G03G 5/082; B05D 3/06
[52] U.S. Cl. ............................... 430/128; 430/136; 427/39
[58] Field of Search ............... 430/128, 136; 427/39, 427/74

[56] References Cited

U.S. PATENT DOCUMENTS 4,226,898 10/1980 Ovshinsky et al. ............ 430/136 X
4,265,991  5/1981 Hirai et al. .................... 430/136 X
4,328,258  5/1982 Coleman ............................ 427/39
4,357,179 11/1982 Adams et al. .................. 430/136 X

OTHER PUBLICATIONS

D. E. Carlson et al., "Properties of Amorphous Silicon and A–Si Solar Cells", RCA Review, vol. 38, pp. 211 to 225, Jun. 1977.
B. A. Scott et al., "Glow Discharge Preparation of Amorphous Hydrogenated Silicon from Higher Silanes", Appln. Phip. Letters 37(8), pp. 725 to 727, Oct. 1980.

Primary Examiner—Roland E. Martin, Jr.
Attorney, Agent, or Firm—Brumbaugh, Graves, Donohue & Raymond

[57] ABSTRACT

Disclosed are method and apparatus for producing amorphous silicon layers for solar cells or electrophotography by plasma-enhanced chemical vapor deposition (CVD) through glow-discharge decomposition of a reaction gas containing monosilane or a higher order silicon hydride in a reaction chamber. Deposition rate and efficiency of reaction gas usage are improved by the selective removal of hydrogen gas reaction product from the reaction chamber. In one embodiment, a filter which is more permeable to hydrogen gas than to the reaction gas is placed in the vacuum pumping port of the reaction chamber. The filter comprises either a palladium film or a bundle of small diameter tubes made from a polyimide system polymer. In another embodiment of the invention, a porous sintered material containing La–Ni alloy is used to selectively adsorb hydrogen gas in the reaction chamber. In still another embodiment of the invention, a trap which collects reaction gas but passes hydrogen gas is used in the vacuum pump line connected to the chamber. The trap comprises a cell cooled to liquid nitrogen temperature for condensing the reaction gas but not the hydrogen. The collected reaction gas is recycled through the reaction chamber. The removal rate of hydrogen gas is controlled to maintain a desired hydrogen density in the reaction chamber, the hydrogen density being monitored by observing the intensity of hydrogen spectral lines in the glow discharge in the reaction chamber.

10 Claims, 5 Drawing Figures

METHOD OF PRODUCING AMORPHOUS SILICON LAYER AND ITS MANUFACTURING APPARATUS

BACKGROUND OF THE INVENTION

This invention relates to a method and apparatus for producing an amorphous silicon layer used for solar cells or photosensitive films for electrophotography. More particularly, the invention concerns a production of an amorphous silicon photosensitive layer used for photosensitive films for electrophotography required for high thickness as compared with that of solar cells. That is, the thickness of the photosensitive layer is required for several microns or several tens microns while the thickness of the solar cells is about 1 microns.

For producing the amorphous silicon (hereinafter given by a—Si) layer, various techniques, such as vacuum deposition techniques, reactive sputtering techniques, ion plating techniques, CVD techniques, plasma CVD techniques, etc., have been proposed. When a layer with large area, particularly used for solar cells, photosensitive films for electrophotography, etc., is produced, the plasma CVD techniques superior in uniformity have been generally adopted. That is, using a gas of silicon hydride such as monosilane ($SiH_4$) as a raw material, such a gas is introduced into a reaction chamber kept at desired vacuum degree and a glow discharge is generated therein by means of DC bipolar techniques, AC electrostatic coupling techniques, or AC electromagnetic induction coupling techniques so as to decompose the reaction gas, thereby depositing a—Si layer on a heated substrate (for example, referring to D. E. Carlson, C. R. Wronski, J. I. Pankove, P. J. Zanzuechi and D. L. Staebler, "RCA Review" Vol. 38, pp 211–225, June 1977). The deposition rate of a—Si layer is several microns/hour according to the method. However, it is desirable that the deposition rate is as fast as possible in the case of the industrial production.

SUMMARY OF THE INVENTION

It is an object of the present invention to provide a method and apparatus for improving a deposition rate of a—Si layer.

The object can be accomplished by removing hydrogen from a reaction gas for producing a—Si layer by using the plasma CVD techniques.

The present invention depends upon such a recognition that the deposition rate is lowered according to the increase of hydrogen density within the reaction gas for producing a—Si layer. In order to keep the reaction chamber at desired vacuum degree, an atmosphere within the reaction chamber is absorbed and exhausted all the time. Therefore, the greater part of the raw gas is exhausted without reaction to lower its utilization rate. In order to improve the utilization rate, for example, when the exhaust rate is reduced to decrease the supply rate of the raw gas, the hydrogen density within the reaction gas is increased due to hydrogen resulting from the reaction. However, the increase of the hydrogen density can be prevented by providing with means for removing hydrogen from the reaction gas according to the present invention, thereby increasing the deposition rate. On the contrary, hydrogen atoms will be coupled with dangling bonds in a—Si to reduce the structural defects. Therefore, it will be possible to perform the valence electron control of a—Si. Accordingly, in order to obtain high quality a—Si layer, it must be avoided to remove excessively hydrogen within the reaction chamber. For this reason, a device for measuring hydrogen spectral intensity of plasma within the reaction chamber will be arranged at the outside of the chamber to control the partial pressure of hydrogen therewithin.

According to one aspect of the present invention, it will be possible to improve greatly the deposition rate by using higher order silicon hydride as the reaction gas. According to the report by B. A. Scott (Appl. Phys. Lett, Vol. 37, pp 725–727), when a gas composed mainly of higher order silicon hydride such as $Si_2H_6$ or $Si_2H_8$ is employed as a reaction gas instead of the gas composed mainly of monosilane ($SiH_4$), the deposition rate increased by about 20 times can be obtained as shown in Table 1.

TABLE 1

| Reaction Gas | Pressure (m Torr) | Flow Rate (cc/min) | Deposition Rate (Å/sec) |
|---|---|---|---|
| $SiH_4$ | 70 | 3 | 0.6 |
| $Si_2H_6$ | 70 | 3 | 13.7 |
| $Si_3H_8$ | 35 | 1.5 | 14.6 |

Accordingly, if the reaction gas is changed from $SiH_4$ system to $Si_2H_6$ system, the deposition time of the photosensitive film required for above 10 hours will be reduced by below several hours. It has been known that such higher order silicon hydrides are produced by polymerizing $SiH_4$ system gas by a silent discharge. In this case, the reaction given by $2SiH_4 \rightarrow Si_2H_6 + H_2$ is carried out to generate hydrogen of a by-product. The higher order silicon hydrides can be employed as reaction gases applicable to the plasma CVD techniques by removing the hydrogen therefrom according to the present invention. Therefore, it will be desirable that both a device for synthesizing the higher order silicon hydride by using $SiH_4$ system gas and means for continuously removing the hydrogen generated by the synthetic reaction are arranged between CVD reaction chamber and $SiH_4$ system gas supply system. A silent discharge device or ultraviolet irradiation device can be used as devices for synthesizing the higher order hydrogen hydrides by employing $SiH_4$ system gas.

According to another aspect of the present invention, it will be possible to recover and reuse the gas exhausted from the reaction chamber of the plasma CVD technique. That is, after the hydrogen is removed from the reaction gas exhausted from the reaction chamber, the reaction gas is again supplied to the reaction chamber. The exhaust gas, which is produced when $SiH_4$ gas is used as the reaction gas, contains the higher order silicon hydride which is generated when the reaction gas passes through the plasma within the reaction chamber. According to the supply of the higher order silicon hydride, higher deposition rate can be performed as compared with the supply of new $SiH_4$ system gas, and the utilization rate of the reaction gas can also be increased due to the reuse of the exhaust gas.

For removing the hydrogen from the reaction gas according to the present invention, it will be desirable that the hydrogen is selectively exhausted from the reaction gas. A vacuum exhaust device may be connected to the reaction chamber through a hydrogen-permeable membrane for that purpose. For example, palladium film or polyimide system polymer films can be used as the hydrogen-permeable membranes. Materials for adsorbing hydrogen can also be employed for another removal method. For example, hydrogen storage alloys such as La—Ni system alloys can be used as such materials. The reaction gas may pass through the gas permeable layer made of a porous sintered material of such alloy or made of a filled layer of such alloy powder. On the contrary, using materials preferentially adsorbing silicon hydrides as compared with hydrogen, the remaining hydrogen may be exhausted. As another removal method, the hydrogen which is not collected may be removed by cooling the reaction gas to super low temperature to liquidize or solidify the silicon hydride so as to collect it.

DETAILED DESCRIPTION

The present invention will be described in detail with the accompanying drawings.

Figure 1:
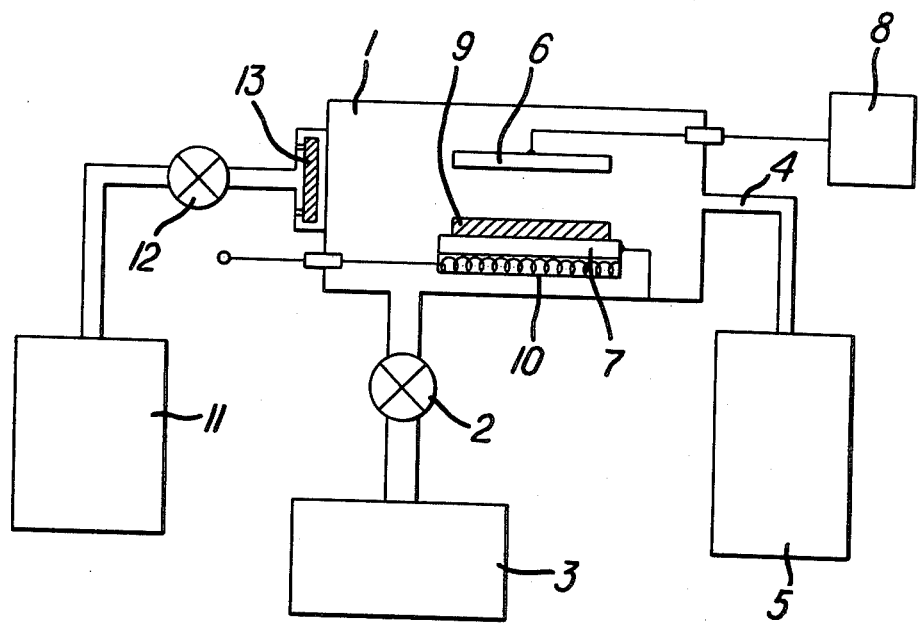
FIG. 1 is a connection diagram containing a cross-sectional view of an apparatus for producing a—Si layer according to one embodiment of the present invention.

In FIG. 1, an exhaust system 3 is connected to a reaction chamber 1 through a valve 2, and a raw gas supply system 5 is also connected to the reaction chamber 1 through a gas supply port 4. Two electrodes 6, 7 oppositely arranged in the reaction chamber 1 are connected to a radio frequency power source 8. One electrode 7 supports a substrate 9 on which a—Si layer is deposited, and includes a heater 10 to heat the substrate 9. According to the present invention, another exhaust system 11 is further connected to the reaction chamber 1 through both a valve 12 and a hydrogen-permeable membrane 13, for example, composed of palladium film. Using such apparatus, a raw gas such as $SiH_4$ is first supplied to the reaction chamber 1 through a raw gas supply port 4, and the gas within the reaction chamber 1 is exhausted from the exhaust port 3 through the valve 2 to keep the pressure within the reaction chamber at desired vacuum degree, for example, at $10^{-1} - 5$ Torr. Or, after the interior of the reaction chamber 1 was kept at of the order of $10^{-5}$ Torr, the valve 2 is closed and the raw gas is introduced into the reaction chamber to obtain desired vacuum degree. The exhaust is carried out by using the auxiliary exhaust system 11 through the valve 12 and the hydrogen-permeable membrane 13, while closing the valve 2. The vacuum degree within the reaction chamber, in which a—Si layer is produced by a glow discharge generated between electrodes 6 and 7, will be kept at a desired value. According to the method, since only the hydrogen gas, which is generated as a produced gas in the deposition process, is exhausted through the hydrogen-permeable film 13, the gas composition within the reaction chamber 1 will be kept at constant for a long time to produce a—Si layer without lowering the deposition rate. In addition, since the raw gas is sufficiently supplied to the reaction chamber by the amount consumed by the reaction, the utilization rate of the raw gas will be remarkably improved without a sacrifice of characteristics of produced a—Si layer. Palladium film, for example, is used as the hydrogen-permeable membrane 13. Since the membrane prevents unwanted contraflow of very small amount of pump oil from the exhaust system, unwanted impurities will not be added to the produced a—Si layer to improve characteristics of the produced layer. In order to better control electrical characteristics of the produced a—Si layer, the intensity of emitting spectral line of hydrogen in the glow discharge generated within the reaction chamber 1 is measured through a window of the reaction chamber to detect the partial pressure of hydrogen therewithin, and the partial pressure of hydrogen within the reaction chamber will be controlled to a desired value by adjusting the exhaust amount of the auxiliary exhaust system 11 through the valve 12. At the result, the hydrogen amount of a—Si layer, deposited on the substrate 9 by the decomposition due to the glow discharge of the reaction gas, will be controlled, thereby providing a—Si layer containing desirable hydrogen content below 1 atom % as it has been known.

When the radio frequency power of 30 W was applied to the apparatus whose reaction chamber was kept at the vacuum degree of 0.7 Torr, the reaction chamber was kept in the atmosphere of 90% $SiH_4$ and 10% $H_2$ in the apparatus shown by FIG. 1. In this case, the deposition rate of a—Si layer became 7 microns/hour. On the contrary, when the radio frequency power of 30 W was applied to a known apparatus from which hydrogen was not removed and whose reaction chamber was kept at 3 Torr, the deposition rate was only 2 micron/hour.

Figure 2:
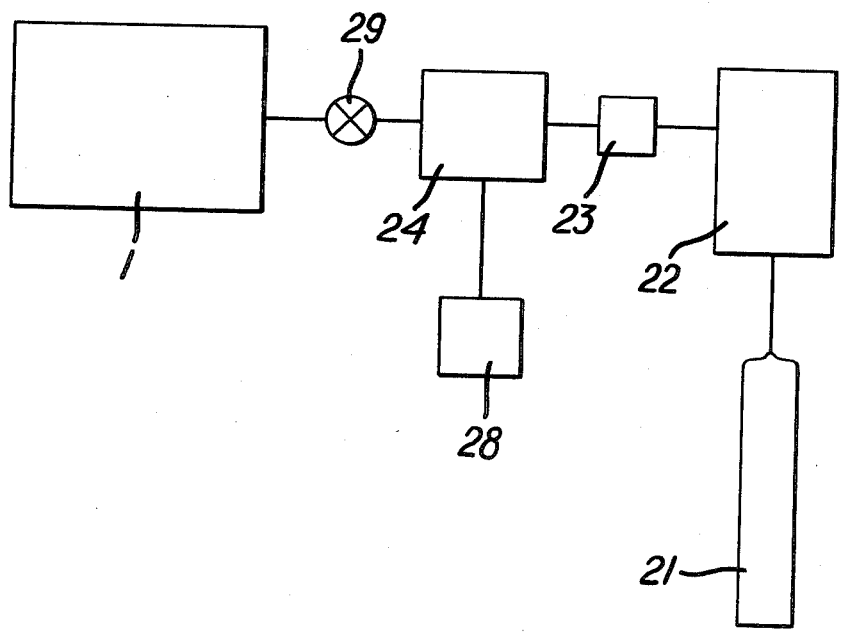
FIG. 2 is a connection diagram of an apparatus for producing a—Si layer according to another embodiment of the present invention.
Figures 3A, 3B:
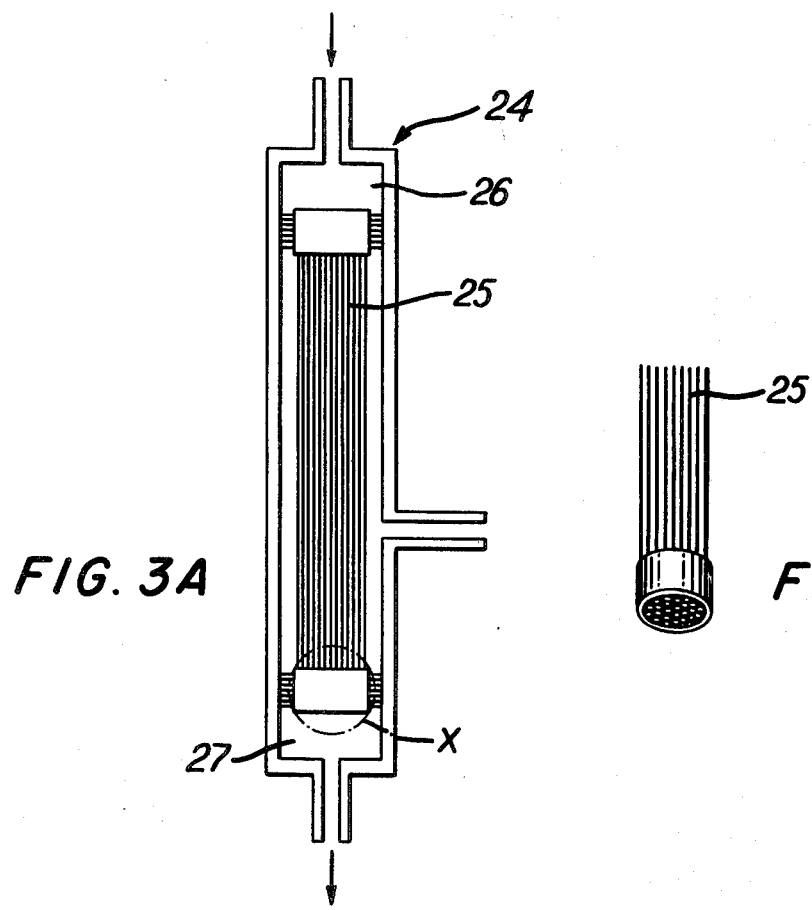
FIG. 3(A) is the cross-sectional view of an exemplary hydrogen removal device.
FIG. 3(B) is a perspective view of x portion of FIG. 3(A)

In FIG. 2, $SiH_4$ system gas such as $SiH_4$ and $SiH_2F_2$, or a mixed gas containing another gases is supplied to a gas modification device 22 from a bottle 21. The gas modification device 22 modifies $SiH_4$ system gas to high order $Si_nH_m$ system compound, and the main reaction is given by $2SiH_4 \rightarrow Si_2H_6 + H_2$ in the case of $SiH_4$. Such a reaction is generated by application of ultraviolet rays (for example, light beam of 2537 Å due to low pressure mercury lamp) of short wavelength in addition to a silent discharge technique. The modified gas containing much amount of $H_2$ fed from the modification device 22 is introduced into a hydrogen removal device 24 through a filter for removing the solid components. The hydrogen removal device 24 is used as a hydrogen-permeable membrane, which is provided by bundling smaller tubes 25 of polyimide system polymer material as shown in FIG. 3(A) and FIG. 3(B) illustrating the perspective view of x portion in FIG. 3(A). The gas from the filter 23 is introduced into the inlet port 26 and reaches the output port 27, while passing through the bundled hydrogen permeable tubes 25 from one end to the other. When the gas passes through the tubes 25, the hydrogen permeates through walls of tubes 25 and is removed to the outside of the device by a suction pump 28. Of course, the hydrogen-permeable membrane will not be limited by the tube-shaped structure as easily supposed. The system having the same function as that of the tube-shaped structure can be obtained by a flat-shaped structure. The modified gas with decreased hydrogen component, which reached the outlet port 27 of the hydrogen removal device, is introduced into the plasma CVD reaction chamber 1. Because the introduced modified gas contains high density $Si_nH_m$ compound of higher order such as, for example, $Si_2H_6$, the deposition rate of a—Si can be remarkably improved as compared with conventional $SiH_4$ system reaction gas as shown in Table 1. In this case, the supply amount of the modified gas can be secured by the control of the gas flow rate, the capacity of the gas modification device 22, etc.

Figure 4:
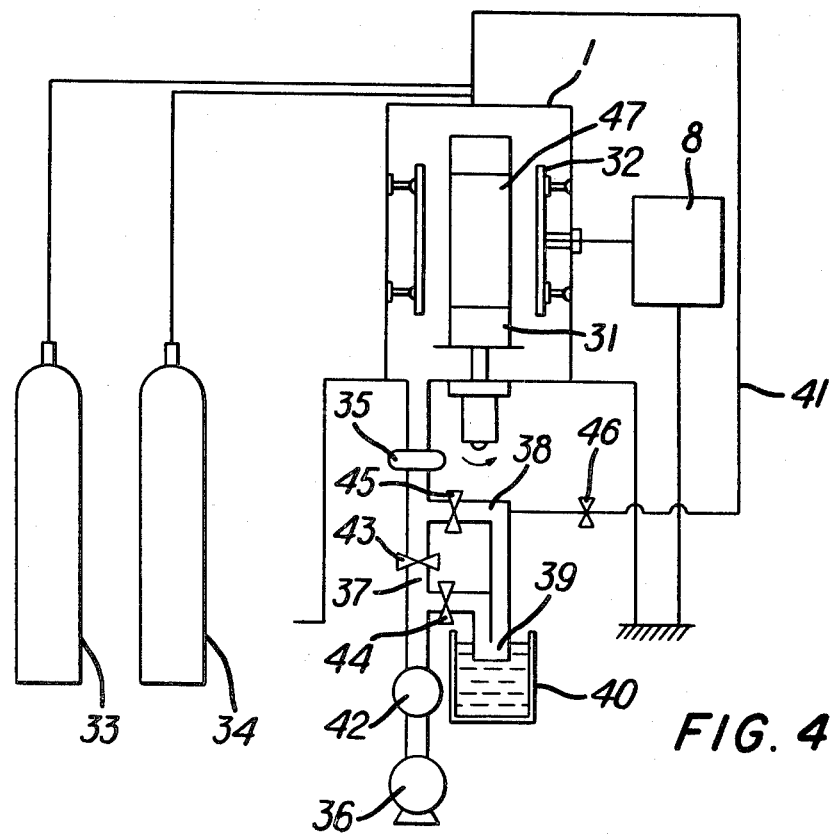
FIG. 4 is a connection diagram containing a cross-sectional view of an apparatus for producing a—Si layer having a reaction gas recovery circuit according to further embodiment of the present invention.

In an apparatus shown in FIG. 4, a raw gas such as SiH$_4$, doping gas, etc is supplied from bottles 33, 34 to a reaction chamber 1 which includes a cylindrical substrate 31 for making a photosensitive film for electrophotography, and a cylindrical electrode 32 connected to a power source 8. The reaction chamber is provided with a by-pass circuit 38 in addition to a main exhaust circuit 37 which includes a pump 36 connected through an oil free auxiliary pump, such as a mechanical booster pump 35 thereto. The by-pass circuit 38 has a gas storage cell 39 for recovering a reaction gas which is not decomposed. The gas storage cell 39 is cooled by immersing it into liquid nitrogen placed in a container 40, and is connected to a gas feedback circuit 41 for returning the recovered gas to the reaction chamber 1. A valve 42 is provided so as to adjust the exhaust capacity of the pump 36, and stop valves 43–46 are also provided in order to open and close respective circuits. In the apparatus having such exhaust system structure, the valves 45, 46 are closed and the valves 42, 43 and 44 are opened at first to exhaust the interior of the reaction chamber 1, the main exhaust circuit 37 and the by-pass circuit 38 through pumps 36,35. Liquid nitrogen is then put into the container 40 to sufficiently cool the gas storage cell 39. The cylindrical substrate is previously heated to a desired temperature by a heater which is not shown. Thereafter, SiH$_4$ gas and the doping gas are introduced into the reaction chamber 1 from bottles 33, 34, and the plasma is generated at a gas pressure below, for example, 1 Torr between the substrate 31 and the electrode 32 by using the radio frequency power source 8 to decompose the reaction gas, thereby depositing a—Si film 47 on the substrate. As soon as the valve 45 is opened and the valve 43 is closed to introduce the reaction gas into the by-pass circuit 38, the exhaust capacity of the pump 36 is lowered by the valve 42 to increase the gas pressure of the by-pass circuit, thereby facilitating the condensation of the reaction gas. Since the vapor pressure of SiH$_4$ gas is one atmospheric pressure (boiling point) at $-112°$ C. and is 10 Torr at $-163°$ C., SiH$_4$ gas may have lower vapor pressure at a temperature of liquid nitrogen, or at $-196°$ C. Accordingly, SiH$_4$ introduced into the gas storage cell 39 is collected by the liquefaction or solidification. On the contrary, since hydrogen generated by the decomposition of SiH$_4$ due to the plasma is gaseous state at the liquid nitrogen temperature, it is exhausted through the valve 42. Since the gas passing through the discharge area within the reaction chamber contains practically higher order Si$_n$H$_m$ system components polymerized by the discharge in addition to SiH$_4$ and H$_2$, it is easily liquidized and collected. When sufficient amount of gas was obtained, the valves 44, 45 are closed and the valve 43 is opened to heat the gas storage cell 39 by removing the liquid nitrogen within the container 40. After the gas collected in the gas storage cell 39 is completely evaporated, the collected gas is supplied to the reaction chamber 1 through the feedback circuit 41 by opening the valve 46. The recovery and the reuse of the gas is thus accomplished, but the storage of unwanted impurities proceeds to cause a problem with respect to the reproducibility of the film quality. Accordingly, when the gas collected by the gas storage cell 39 is mixed with the raw gas supplied from bottles 33, 34 in the process of reuse of the gas, the reproducibility will be stabilized. When the mixing ratio of the collected gas to the raw gas is 1:1, the yield of the reaction gas is 15% to increase remarkably the yield as compared with that of 5% in the case where the recovery and the reuse are not carried out. When the mixing ratio of the collected gas to the raw gas was 7:3, the yield was increased to 20%.

Instead of using the gas storage cell cooled by liquid nitrogen in order to recover the reaction gas, it is also effective to adsorbing preferentially the monosilane system gas with respect to hydrogen by using the adsorption phenomenon of the gas as used in sorption pumping. It is further effective that a porous sintered material of hydrogen storage alloys such as, for example, La—Ni system alloys or a filled layer of such alloy is arranged in the recovery circuit to remove the produced hydrogen by adsorbing it by the alloy material when the reaction gas from the reaction chamber passes therethrough.

We claim:

1. A method for producing an amorphous silicon layer comprising the steps of: introducing a reaction gas composed mainly of silicon hydride into a reaction chamber, exhausting the reaction chamber; generating a plasma within the reaction chamber to decompose the reaction gas therein and to deposit an amorphous silicon layer on a substrate situated within the reaction chamber; and removing hydrogen generated by the decomposition of the reaction gas within the reaction chamber.

2. A method for producing an amorphous silicon layer according to claim 1 further comprising the steps of polymerizing silicon hydride of a lower order to produce a silicon hydride of a higher order and removing hydrogen generated by such polymerization and wherein the silicon hydride of the higher order is introduced into the reaction chamber after removal of such hydrogen.

3. A method of producing an amorphous silicon layer according to claim 2, wherein hydrogen is removed from the reaction chamber by removing hydrogen from the reaction gas exhausted from the reaction chamber and introducing again the exhausted reaction gas into the reaction chamber after removing the hydrogen therefrom.

4. A method of producing an amorphous silicon layer according to claim 2, wherein said lower order silicon hydride is monosilane (SiH$_4$).

5. A method of producing an amorphous silicon layer according to claim 2, wherein an amorphous silicon layer to be produced is a photosensitive layer used for photosensitive film for electrophotography.

6. A method of producing an amorphous silicon layer according to any of claims 4, 1 to 3, wherein hydrogen in said reaction gas is removed by selectively exhausting it.

7. A method of producing an amorphous silicon layer according to any of claims 4, 1 to 3, wherein said reaction gas is cooled to liquidize or solidify said silicon hydride, thereby separating or removing hydrogen.

8. A method of producing an amorphous silicon layer according to any of claims 4, 1 to 3, wherein said silicon hydride within said reaction gas is preferentially adsorbed with respect to hydrogen to remove hydrogen not adsorbed.

9. A method of producing an amorphous silicon layer according to any of claims 4, 1 to 3, wherein hydrogen within said reaction gas is preferentially adsorbed to remove it.

10. A method of producing an amorphous silicon layer according to any of claims 4, 1 to 3, wherein a partial pressure of hydrogen within said reaction chamber is controlled.

* * * * *